(12) United States Patent
Hayashi

(10) Patent No.: US 7,197,439 B2
(45) Date of Patent: Mar. 27, 2007

(54) METHOD FOR MODELING SEMICONDUCTOR DEVICE PROCESS

(75) Inventor: Hirokazu Hayashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 721 days.

(21) Appl. No.: 10/059,176

(22) Filed: Jan. 31, 2002

(65) Prior Publication Data

US 2002/0183991 A1 Dec. 5, 2002

(30) Foreign Application Priority Data

May 29, 2001 (JP) ............... 2001-160692
Aug. 14, 2001 (JP) ............... 2001-246268

(51) Int. Cl.
*G06F 17/10* (2006.01)
*G06F 17/50* (2006.01)
(52) U.S. Cl. ............................................. 703/2; 716/20
(58) Field of Classification Search .................... 703/2; 716/19–21
See application file for complete search history.

(56) References Cited

U.S. PATENT DOCUMENTS

| | | | | |
|---|---|---|---|---|
| 4,607,530 A | * | 8/1986 | Chow ........................... | 702/98 |
| 5,502,643 A | * | 3/1996 | Fujinaga ...................... | 716/21 |
| 5,557,710 A | * | 9/1996 | Amdursky et al. .......... | 345/419 |
| 5,737,250 A | * | 4/1998 | Sawahata ..................... | 716/21 |
| 5,889,687 A | * | 3/1999 | Enda .............................. | 703/4 |
| 5,930,494 A | * | 7/1999 | Akiyama ........................ | 703/7 |
| 5,933,359 A | * | 8/1999 | Sawahata ..................... | 716/20 |
| 5,999,719 A | * | 12/1999 | Asada et al. .................. | 703/12 |

(Continued)

FOREIGN PATENT DOCUMENTS

JP 2000-084716 3/2000

OTHER PUBLICATIONS

"Physics-Based Threshold Voltage Modeling with Reverse Short Channel Effect"; K-Y Lim et al; 1999 Journal of Modeling and Simulation of Microsystems, vol. 2, No. 1, pp. 51-56.*
"The improvement of short-channel effects due to oxidation-induced boron redistribution for counter-implantation p-MOSFET's"; Perng, R.-K. et al; Electron Device Letters, IEEE vol. 14, Issue 5, May 1993 pp. 237-239 □□.*

(Continued)

*Primary Examiner*—Fred Ferris
*Assistant Examiner*—Akash Saxena
(74) *Attorney, Agent, or Firm*—Volentine & Whitt, P.L.L.C.

(57) ABSTRACT

A method for using a computer to calculate a pileup state of an impurity in an interface between an Si layer in which a source and a drain are formed, and an $SiO_2$ layer brought in contact with the Si layer at a high speed, wherein data is first set assuming that the Si layer is constituted of a plurality of cells. Subsequently, the impurity is moved to a pileup position of the interface from each cell, and an amount of impurity piled up in each pileup position of the interface is calculated. In this case, a mass of the impurity moving to the interface from each cell is determined as a function of a distance to each pileup position from each cell, and a distance to a source or a drain closest to the cell.

2 Claims, 9 Drawing Sheets

U.S. PATENT DOCUMENTS

| | | | | |
|---|---|---|---|---|
| 6,006,026 A | * | 12/1999 | Kumashiro | 703/2 |
| 6,041,174 A | * | 3/2000 | Akiyama | 703/12 |
| 6,080,200 A | * | 6/2000 | Kumashiro | 703/13 |
| 6,120,548 A | * | 9/2000 | Jarvis et al. | 703/2 |
| 6,144,929 A | * | 11/2000 | Kumashiro | 703/2 |
| 6,148,276 A | * | 11/2000 | Sakamoto | 703/13 |
| 6,154,717 A | * | 11/2000 | Kumashiro | 703/2 |
| 6,154,718 A | * | 11/2000 | Sakamoto | 703/12 |
| 6,242,272 B1 | * | 6/2001 | Kumashiro et al. | 438/14 |
| 6,285,970 B1 | * | 9/2001 | Akiyama | 703/2 |
| 6,327,555 B1 | * | 12/2001 | Shimizu et al. | 703/12 |
| 6,505,147 B1 | * | 1/2003 | Kumashiro | 703/2 |
| 6,581,028 B1 | * | 6/2003 | Hayashi | 703/2 |
| 6,594,625 B2 | * | 7/2003 | Hayashi | 703/2 |
| 6,684,181 B1 | * | 1/2004 | Sawahata | 703/2 |
| 2001/0025367 A1 | * | 9/2001 | Hayashi | 716/11 |

OTHER PUBLICATIONS

"A highly efficient adaptive mesh approach to semiconductor device simulation-application to impact ionization analysis"; Dang, R. et al; Magnetics, IEEE Transactions on vol. 27, Issue 5, Sep. 1991 pp. 4162-4165 □□.*

New models for the simulation of polysilicon impurity diffusion sources for a wide range of process conditions; Kamohara, S. et al; Bipolar/BiCMOS Circuits and Technology Meeting, 1992., Proceedings of the Oct. 7-8, 1992 1 pp. 126-129.*

"Mathworld: Solid Angle"; 1999; http://mathworld.wolfram.com/SolidAngle.html.*

Wikipedia "Solid Angle" definition -evidentiary support document—2006—http://en.wikipedia.org/wiki/Solid_angle.*

Bronshtein, I.N. et al., "Handbook of Mathematics", 1964.

* cited by examiner

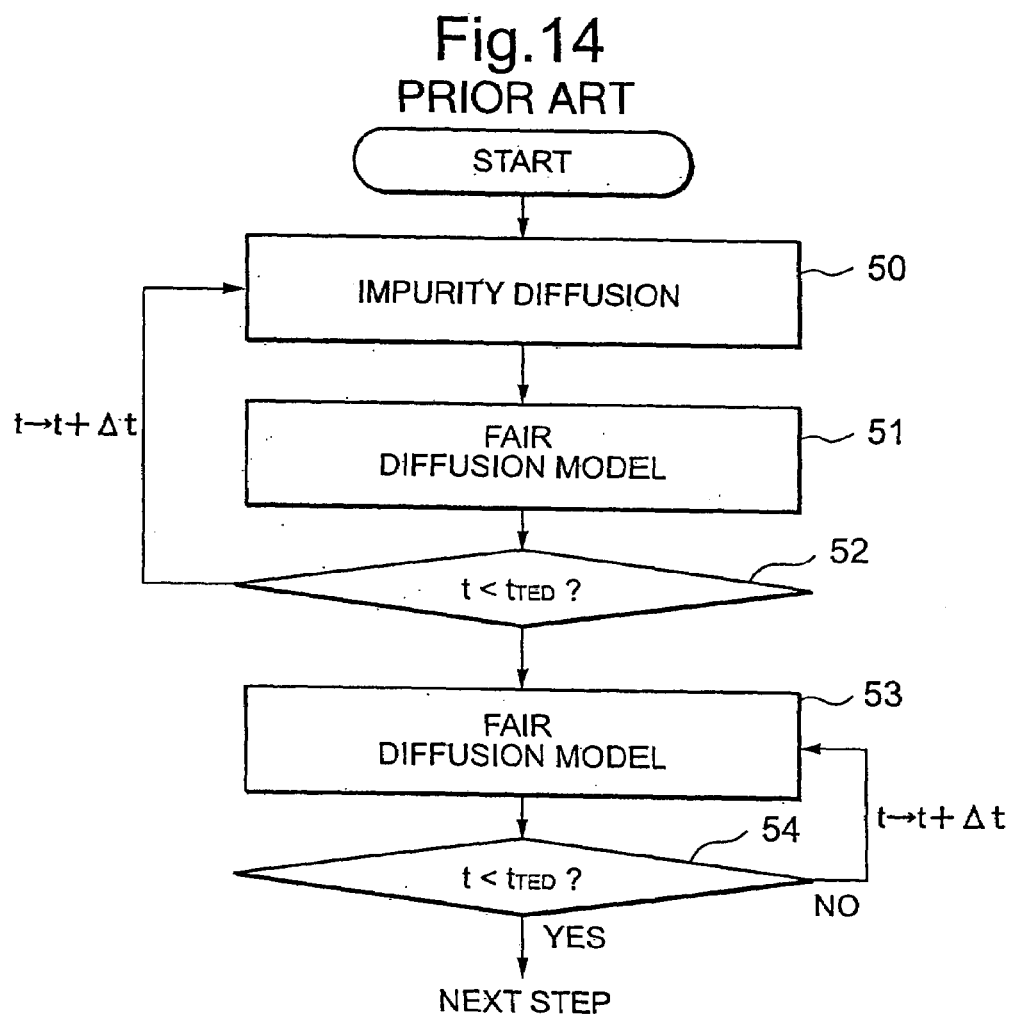

METHOD FOR MODELING SEMICONDUCTOR DEVICE PROCESS

BACKGROUND OF THE INVENTION

1. Field of the Invention

The present invention relates to a method for modeling a semiconductor device process, particularly to a modeling method of impurity diffusion in a semiconductor, and a reverse snort channel effect of a threshold voltage of a MOS type field-effect transistor (MOSFET).

This application claims priority under 35 U.S.C. 119 to Japanese Application Serial Number 246268/2001, filed May 29, 2001, the subject matter of which is incorporated herein by reference.

2. Description of the Related Art

FIG. 9 shows a mechanism of impurity diffusion in a case in which an excessive point defect exists in a semiconductor. An excessive point defect I is generated mainly in a high-dosage ion-implantation process. Particularly, the excessive point defect I generated in a source and drain (S/D) ion-implantation process of the MOSFET forms a pair with an impurity A by an immediately subsequent thermal treatment for allowing an ion to diffuse, and a pair AI of the impurity and point defect repeats separation and coupling, and diffuses. Thereafter, pairs AV and AI reach an interface between Si and SiO$_2$, the point defect I of the pair disappears, and the impurity A having formed the pair piles up. Additionally, V denotes a void, IV denotes a pair of the point defect and void, and AV denotes a pair of the impurity and void.

FIGS. 10A–10C respectively show a relation between a distance of a channel direction Distance, and an impurity density Conc. in a case in which a gate length is set to 2.03 µm, 0.52 µm, and 0.21 µm. In the drawing, a portion having a low impurity density corresponds to a channel, and a rise of the impurity density by impurity pileup is seen in portions corresponding to the drain and source on opposite sides of the channel.

A pileup amount is largest in a gate end close to an S/D implantation position, and decreases toward the channel. A reverse short channel effect of a threshold voltage of the MOSFET (a phenomenon in which the threshold voltage increases with a shorter gate length) is deemed to occur by the pileup as a main factor.

FIG. 11 shows a relation between a gate length Lg and a threshold voltage Vth when a substrate bias VB is 0V, –3V, –5V. In a semiconductor device, when a device dimension is reduced so as to enhance a response speed and integration degree, the gate length is generally and accordingly shortened.

On the other hand, the threshold voltage Vth is preferably constant regardless of the gate length Lg in a circuit design. However, the reverse short channel effect is seen. That is, when the gate length Lg is shortened (about 1 µm or less in FIG. 11), the threshold voltage Vth vertically fluctuates.

A conventional model for describing impurity diffusion in the semiconductor is roughly classified in three. That is, a first model is a method including: setting an analysis object region; solving one diffusion equation with respect to each impurity; and calculating an impurity distribution in the semiconductor (hereinafter referred to as a Fair model). A second model is a method including: setting the analysis object region; assuming that the point defect and impurity form a pair and diffuse, and solving respective diffusion equations with respect to the point defect, and the pair of impurity and point defect; and calculating the impurity distribution in the semiconductor (hereinafter referred to as a pair diffusion model). A third model is a simple model for setting an analysis region, and simply taking the effect in a frame of the Fair model without solving the diffusion equation associated with the point defect.

The following equations are equations for use in using the Fair model and pair diffusion model to obtain the impurity distribution in the semiconductor.

Fair Model $$\partial C_A / \partial t = -\nabla J_A \quad \text{(Equation 12)}$$

Pair Diffusion Model $$\partial C_I / \partial t + \Sigma \partial C_{AI} / \partial t = -\nabla J_I - \Sigma \nabla J_{AI} - R_{I,V} + R_{IV} \quad \text{(Equation 13)}$$

$$\partial C_V / \partial t + \Sigma \partial C_{AV} / \partial t = -\nabla J_V - \Sigma \nabla J_{AV} - R_{I,V} + R_{IV} \quad \text{(Equation 14)}$$

$$\partial C_{Atotal}/\partial t = \nabla \{D_{AI} C_{Atotal}(C_I/C_I^*) \nabla (\log(pC_{Atotal} C_I / C_I \cdot ni))\} + \nabla \{D_{AV} C_{Atotal}(C_V/C_V^*) \nabla (\log(pC_{Atotal} C_V / C_V \cdot ni))\} \quad \text{(Equation 15)}$$

Here,
C: density (cm$^{-3}$) $C_{Atotal} = \Sigma C_A + \Sigma C_{AI} + \Sigma C_{AV}$
J: flux (cm$^{-2}$/s)
R: re-coupling speed (cm$^{-3}$/s)
P: carrier density (cm$^{-3}$)
C*: equilibrium density (cm$^{-3}$)
ni: intrinsic carrier density (cm$^{-3}$)
D: diffusion constant
A: all dopant species
I: interstitial
V: vacancy
AI: pair of dopant species and interstitial
IV: pair of interstitial and vacancy
AV: pair of dopant species and vacancy As shown above, for the first Fair model, since the number of equations to be solved is small, a calculation time is short, and the model can advantageously easily be handled. On the other hand, an influence of the point defect with respect to the impurity diffusion is not handled, and therefore there is a disadvantage that the impurity pileup in the interface of Si and SiO$_2$ cannot be reproduced.

In the second pair diffusion model, since the influence of the point defect with respect to the impurity diffusion is strictly handled, simulation can advantageously be performed with a high precision. On the other hand, when the number of impurities increases, the number of equations to be solved also increases, and the calculation time disadvantageously increases.

The third simple model has an advantage that tradeoff of the calculation time and simulation precision can well be absorbed, but a degree of reproduction of an application range of the model and process dependence is a key.

Examples of the simple model include a simple model disclosed, for example, in Japanese Patent Application Laid-Open No. 084716/2000. FIG. 12 is an explanatory view of the simple model, FIG. 13 is a diagram showing a lateral distribution of the impurity pileup in an end of a gate electrode in the semiconductor substrate, and FIG. 14 is a flowchart showing the simple model.

In FIG. 12, C(xi,yj) denotes the impurity density of each cell, ΔC(xi,yj) denotes the impurity density which decreases in each cell, and ΔS(xi,yj) denotes an area of each cell. An amount of the impurity included in the cell (x1,y1) at the interface is C(x1,y1)ΔS(x1,y1) before the diffusion, and C(x1,y1)ΔS(x1,y1)+ΔC(xi,yj)ΔS(xi,yj) after the diffusion. In FIG. 13, Cint(x) denotes the impurity pileup amount in the interface, and Cpile denotes the impurity pileup amount in a region in which a gate 10 is not disposed. FIG. 13 shows that the pileup amount of the impurity decreases according to Equation 16 in a portion closer to a middle portion of the gate 10. Moreover, the impurity pileup amount is constant at Cpile in the region where the gate 10 is not disposed.

$$\text{Cint}(x) = \text{Cpile} \exp(-x/\lambda \text{int}) \quad \text{(Equation 16)}$$

In FIG. 14, t denotes time. Particularly, $t_{TED}$ denotes a transient enhanced diffusion (TED) duration.

As shown in FIGS. 12, 13 and 14, first an Si layer is divided into a plurality of cells. For the impurity pileup in the interface of Si and $SiO_2$ which cannot be reproduced by the Fair model, instead of solving the diffusion equation associated with the point defect, a part of an impurity amount of a substrate region is moved to the interface of Si and $SiO_2$ and constitutes the pileup. An impurity movement mass is used as a function of a distance of a noted interface position to the cell of the substrate region in a method for use.

When the diffusion model is used to model the reverse short channel effect of the threshold voltage, for example, the following methods are used:

(1) a method of using the pair diffusion model to calculate the impurity distribution, and calculating an electric property in an unchanged state; and (2) a method of using the simple model to calculate the impurity distribution, and calculating the electric property in the unchanged state.

However, the aforementioned methods have some problems.

1. In the pair diffusion model, the calculation time increases. Therefore, when simulations such as sensitivity analysis among the process, device, and circuit, process optimization, process dispersion analysis, and calibration of a model parameter need to be executed a plurality of times, it is difficult to use the pair diffusion model.

2. In the conventional simple model, since the calculation of a mass of impurity moving to the interface of Si and $SiO_2$ is represented by the function only of the interface position and the distance to the cell of the substrate region, dependence of the S/D process on an impurity density re-distribution cannot be reproduced.

3. Moreover, in the conventional simple model, a shape of the impurity pileup in the interface is determined beforehand. Therefore, there is a problem that the dependence of the process on the shape of the pileup cannot be predicted.

SUMMARY OF THE INVENTION

An object of the present invention is to provide a method for modeling a semiconductor device process in which:

S/D process dependence of an impurity pileup in an interface between Si and $SiO_2$ can be reproduced in a frame of a Fair model, a shape of the impurity pileup can be predicted, an impurity profile can be used to reproduce a reverse short channel effect of a threshold voltage, and a high-speed calculation is possible.

To achieve the object, according to the present invention, there is provided a method comprising: a first step of setting data of an $SiO_2$ layer; a second step of setting data of an Si layer formed in contact with the $SiO_2$ layer; a third step of setting a plurality of cells in the Si layer, and setting an amount of an impurity included in each cell; a fourth step of setting an amount per unit time by which the impurity included in each cell moves to another cell; a fifth step of setting data by which a cell in the vicinity of an interface of the $SiO_2$ layer and the Si layer is set as an impurity pileup portion; a sixth step of setting data of a position of a source or a drain in the Si layer; and a seventh step of calculating the amount of the impurity included in each cell for each unit time after each of the first step, the second step, the third step, the fourth step, the fifth step, and the sixth step ends, wherein a mass of impurity moving to the pileup portion from each cell is determined as a function of a distance to the impurity pileup portion from each cell (hereinafter referred to as distance r1), and a distance to the source or the drain from each cell (hereinafter referred to as distance r2).

BRIEF DESCRIPTION OF THE DRAWINGS

FIG. 14 is a flowchart showing a process of the method for modeling the semiconductor device process in the conventional simple model.

DETAILED DESCRIPTION OF THE PREFERRED EMBODIMENTS

Figure 1:
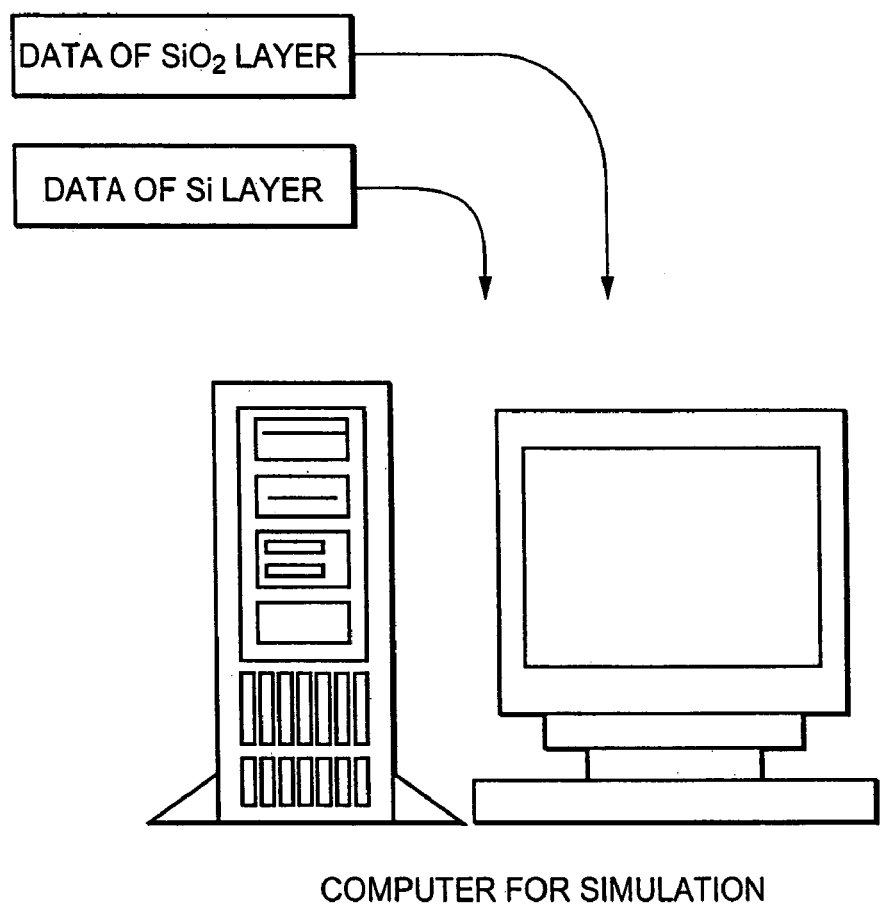
FIG. 1 is a block diagram showing a computer for simulation and data to be inputted into the computer.

Preferred embodiments of a method for modeling a semiconductor device process according to the present invention will be described hereinafter in detail with reference to the accompanying drawings. Additionally, in the present specification and drawings, constituting elements having substantially the same functions/constitutions are denoted with the same reference numerals and redundant description thereof is omitted.

(First Embodiment)

In a method for modeling the semiconductor device process according to a first embodiment, for a conventional simple model which cannot reproduce S/D process dependence, instead of solving a diffusion equation associated with a point defect, a part of an impurity amount of a substrate region is moved to an interface of Si and $SiO_2$ to constitute an impurity pileup, and an impurity movement mass is determined as a function of a distance r1 from a pileup position and a distance r2 to an S/D profile position of a closest interface.

In the conventional simple model, for example, when an S/D implantation dosage is changed, dependence of an S/D process on the impurity pileup in the interface cannot be reproduced. This is because information on the S/D process is not reflected with respect to calculation of the mass of impurity moving to the interface of Si and $SiO_2$ from each cell in an Si layer.

Figure 2:
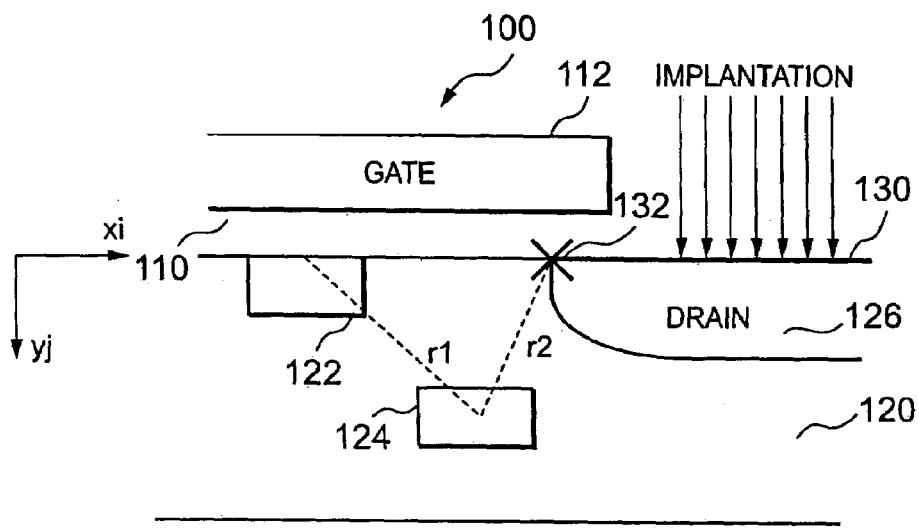
FIG. 2 is an explanatory view of a method for modeling a semiconductor device process according to a first embodiment.

FIG. 1 is a block diagram showing a computer for simulation and data to be inputted into the computer according to the present invention, and FIG. 2 is an explanatory view of the method for modeling the semiconductor device process according to the first embodiment. As shown in FIG. 2, a gate 112 is formed on an upper $SiO_2$ layer 110 of a semiconductor element 100 via an interface of Si and $SiO_2$ 130, and a drain 126 is formed on a lower Si layer 120. An S/D profile position 132 changes with conditions of implantation, and the like.

It is now assumed that the Si layer 120 is divided into a plurality of cells, and an impurity pileup amount Cint(x) in a cell 122 of the interface is calculated based on the following Equation 1.

$$Cint(x) = \Sigma \Delta C(xi, yj) \qquad \text{(Equation 1)}$$

It is assumed that an original impurity amount C(xi,yi) moves from an arbitrary cell 124 having an area ΔS(xi,yi) and an impurity amount ΔC(xi,yi) piles up in the cell 122. As shown in FIG. 1, first, a step of inputting data of $SiO_2$ and Si layers into the computer is performed. That is, data concerning the S/D process dependence and Si layer density dependence, and the like are inputted.

An impurity movement mass ΔC(xi,yi) is determined as the function of the distance r1 from the pileup position and the distance r2 from the S/D profile position 132 of the closest interface, so that the S/D process dependence of the mass of impurity moving to the interface 130 can be reproduced based on the following Equations 2, 3, and 4.

$$\Delta C(xi,yj) = A \times Pb \times Pi \times C(xi,yj) \times \Delta S(xi,yj) \qquad \text{(Equation 2)}$$

$$Pb = \exp(-r1/\lambda 1) \qquad \text{(Equation 3)}$$

$$Pi = \exp(-r2/\lambda 2) \qquad \text{(Equation 4)}$$

Parameters: A, α, β, λ1, λ2
C(x,y): impurity density in (x,y)
ΔS(x,y): cell area in (x,y)

Here, a parameter A relates to a magnitude of a reverse short channel effect, α and λ1 are parameters concerning the S/D process dependence, and β and λ2 are parameters concerning Si layer density dependence.

As an example, calculation can be performed assuming that a size of the cell ΔS is $10^{-4}$ $\mu m^2$, original impurity amount C is $10^{17}$ $cm^{-3}$, and impurity movement mass ΔC is $2 \times 10^{16}$ $cm^{-3}$ (20% of the original impurity amount C). Moreover, it can be assumed that the parameter A, S/D process dependence α and λ1, and parameters β and λ2 concerning the Si density dependence are $3.7 \times 10^{-3}$, 1.0, 2.0 μm, 1.0, 0.5 μm, respectively.

For example, when the S/D implantation dosage increases, the S/D junction position 132 of the interface shifts to a channel side, therefore the distance r2 is shortened with respect to the cell in the vicinity of the channel, the mass of impurity moving to the interface 130 increases, and as a result the S/D process dependence of the interface on the impurity pileup can be reflected.

According to the first embodiment, the S/D profile dependence onto the impurity pileup in the interface can easily be taken, and it is further possible to predict a pileup shape with respect to a process condition.

(Second Embodiment)

In the method for modeling the semiconductor device process according to a second embodiment, an S/D profile reference position of the distance r2 is determined as a distance from a constant density line 127 of an S/D profile in the first embodiment.

Figure 3:
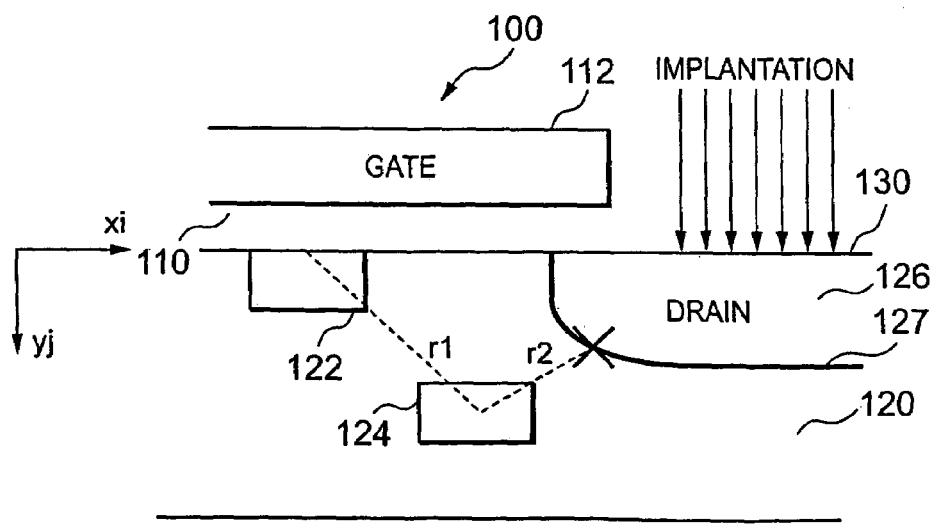
FIG. 3 is an explanatory view of the method for modeling the semiconductor device process according to a second embodiment.

FIG. 3 is an explanatory view of the method for modeling the semiconductor device process according to a second embodiment. A size and shape of the impurity pileup in the interface 130 depend on an excessive point defect density generated by an S/D implantation damage, and also influence an initial point defect distribution.

The initial point defect distribution is regarded as an S/D shape, and the impurity movement mass is determined as a function of a distance r1 from the pileup position and a distance r2 from a closest constant density line 127 of the S/D profile, so that the S/D process dependence of the mass of impurity moving to the interface can be reproduced. Equations for use conform to those of the first embodiment.

According to the second embodiment, there is an advantage that an effect of the S/D shape changing in accordance with an energy and dosage of S/D can be reflected in impurity pileup calculation in the interface 130.

(Third Embodiment)

In the method for modeling the semiconductor device process according to a third embodiment, a solid angle is considered in calculating the mass of impurity moving to the interface 130 from the arbitrary cell 122 in the Si layer such as the substrate in the first and second embodiments.

Figure 4:
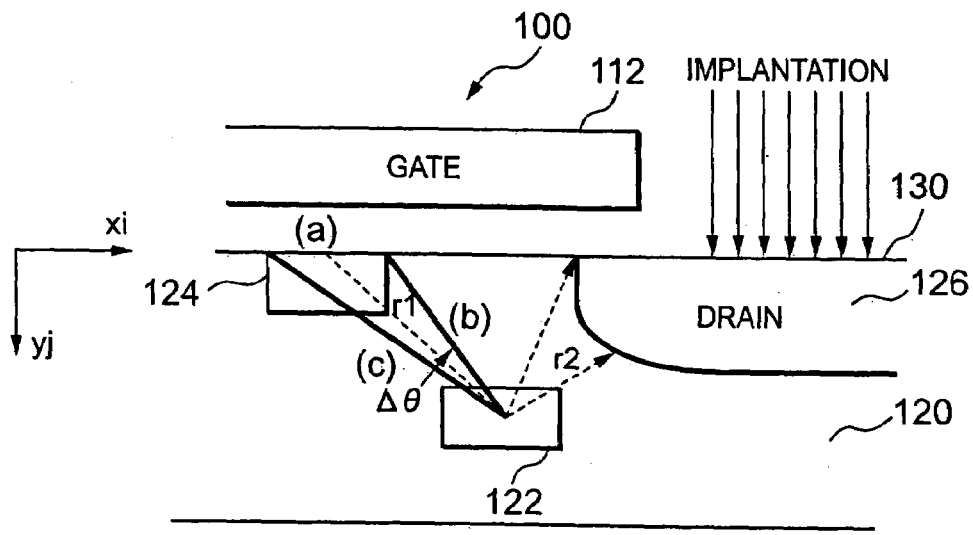
FIG. 4 is an explanatory view of the method for modeling the semiconductor device process according to a third embodiment.

FIG. 4 is an explanatory view of the method for modeling the semiconductor device process according to the third embodiment. In the calculation of the mass of impurity moving to the interface 130 from the arbitrary cell 122 in the Si layer, even when the distance r1 to the cell 124 of the interface from the arbitrary cell 122 in the Si layer is the same, but when a sectional area obtained by connecting the cell 124 of the interface to the arbitrary cell 122 in the Si layer differs, then the mass of impurity moving to the interface also differs. Therefore, a solid angle Δθ is considered in the calculation of the mass of impurity moving to the interface from the arbitrary cell 122 in the Si layer. The equations for use conform to those of the first embodiment, but Equation 6 is obtained by inserting a term of parameter Pr concerning the solid angle into Equation 2. Equation 6 is used instead of Equation 2.

$$\Delta C(xi,yj) = A \times Pb \times Pi \times \underline{Pr} \times C(xi,yj) \times \Delta S(xi,yj) \qquad \text{(Equation 6)}$$

Arbitrary cell in the Si layer

The following method is an example of a calculation method of the solid angle Δθ. First, a side (a) of the interface cell 124 in the interface, side (b) connecting one of two ends of the side (a) to a representative point of the cell 122, and side (c) connecting the other end of the side (a) to the representative point of the cell 122 are calculated.

Subsequently, the sides (a), (b), and (c) are used to calculate the solid angle Δθ by the following equations.

$$\Delta\theta = \text{ATAN}\,(r/(p-a))$$

$$p = 0.5*(a+b+c)$$

$$r = r1\hat{}(\tfrac{1}{2})$$

$$r1 = (p-a)*(p-b)*(p-c)/p$$

(*quoted from p. 174 of "Basic Mathematics Handbook" authored by Miyamoto, et al., published by Morikita Shuppan, 1990)

This $\Delta\theta$ is assigned to Equation 7, and Equations 1, 3, 4, and 6 are used to calculate the impurity pileup amount Cint(x).

$$Pr = \Delta\theta/2\pi \quad \text{(Equation 7)}$$

According to the third embodiment, in the calculation of the mass of impurity moving to the interface from the arbitrary cell in the Si layer, since the solid angle is considered, position dependence between two cells can advantageously be reflected in forming the impurity pileup in the interface.

(Fourth Embodiment)

In the method for modeling the semiconductor device process according to a fourth embodiment, the calculation of the impurity movement to the interface from the arbitrary cell in the Si layer is performed also using generation and disappearance terms of the diffusion equation in the first, second, and third embodiments. The equations for use conform to those of the first embodiment.

Figure 5:
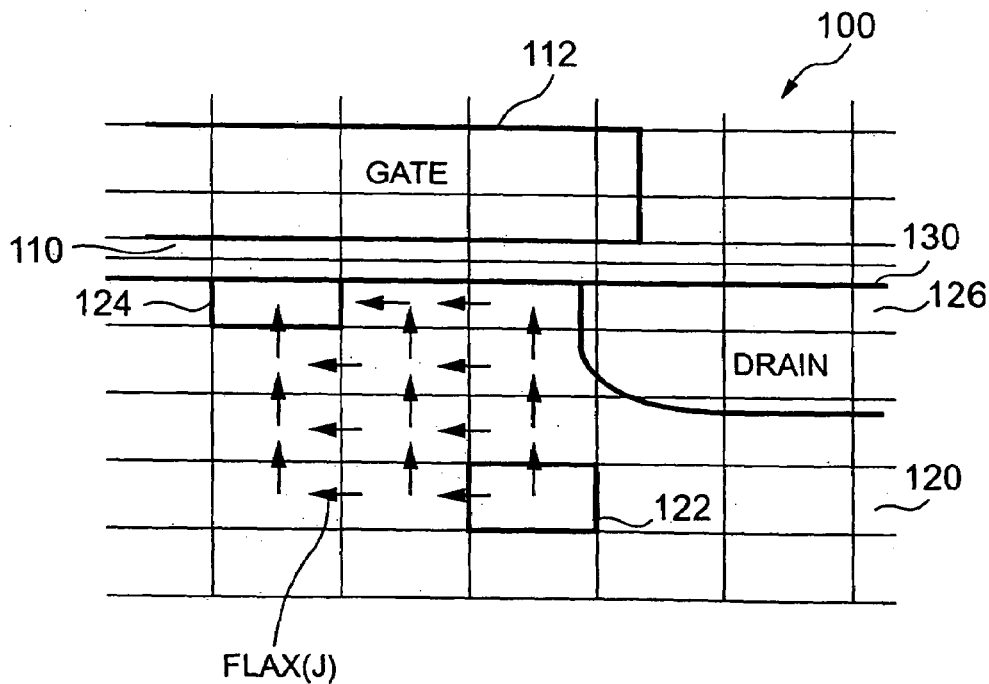
FIG. 5 is an explanatory view of the method for modeling the semiconductor device process according to a fourth embodiment.

FIG. 5 is an explanatory view of the method for modeling the semiconductor device process according to the fourth embodiment. In the conventional simple model, for the impurity movement to the interface from the arbitrary cell 122 in the Si layer, it is presumed that the impurity momentarily moves to the interface out of the Si layer. This is because the point defect diffuses very fast. Additionally, in fact, during movement, some of impurities remain in the substrate, and this influence becomes clear in a lower-temperature heat treatment.

Therefore, some of the movement mass of impurities are assigned to the impurity generation and disappearance terms of the diffusion equations such as Equations 7 and 8, and a method of direct addition to the cell of the interface is also used, so that the impurity on the cell being moved is indirectly influenced. This is a characteristic of the method for modeling the semiconductor device process according to the fourth embodiment. Here, since a total mass of impurities has to be stored in an analysis region, generation and disappearance amounts of impurities have to be set to be equal to each other.

$$\frac{\partial C}{\partial t} + \text{div} J = 0 \quad \text{(Equation 7)}$$

$$\frac{\partial C}{\partial t} + \text{div} J = -\Delta C^* \text{ or } +\Delta C^* \quad \text{(Equation 8)}$$

Generation: $+\Delta C^*$

Disappearance: $-\Delta C^*$ [cm$^{-3}$/s]

Here, $$J = -D \text{ grad } C \quad \text{(Equation 9)}$$

C: impurity density
D: diffusion constant
t: time
$\Delta C^*$: generation or disappearance amount of C As shown in FIG. 5, some of the mass of impurities are allowed to disappear in the arbitrary cell 122 in the Si layer based on Equation 7 ($-\Delta C^*$), and generated on the cell 124 of the interface ($+\Delta C^*$). This indirectly influences the respective cells through a flow of impurities FLAX(J) shown by arrow marks in accordance with Equation 8.

As an example, calculation can be carried out assuming that $-\Delta C^*$ is $2\times10^{16}$ cm$^{-3}$, and $+\Delta C^*$ is $2\times10^{16}$ cm$^{-3}$.

According to the fourth embodiment, an effect that some of the mass of impurities moving to the interface from the respective cells in the Si layer remain during movement can indirectly be taken, and an application range can advantageously be extended also to the low-temperature heat treatment in which the effect becomes clear.

(Fifth Embodiment)

In the method for modeling the semiconductor device process according to a fifth embodiment, in the first and second embodiments, an exceptional processing is performed in a case in which a plurality of S/D regions and isolated regions formed of the same type of impurities exist. In the method, a mask is used to segment a region formed as an object by implantation, and a region formed beforehand.

Figure 6:
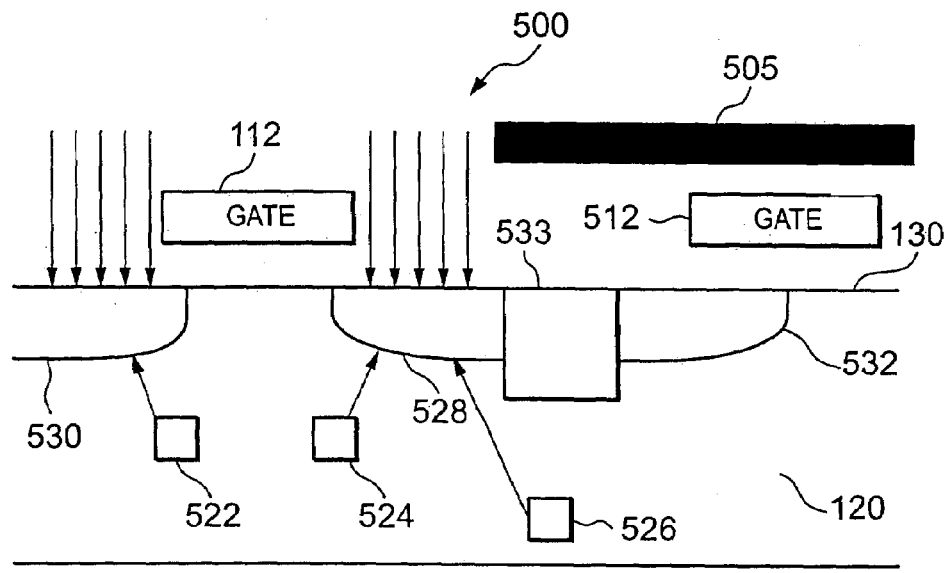
FIG. 6 is an explanatory view of the method for modeling the semiconductor device process according to a fifth embodiment.
Figure 7:
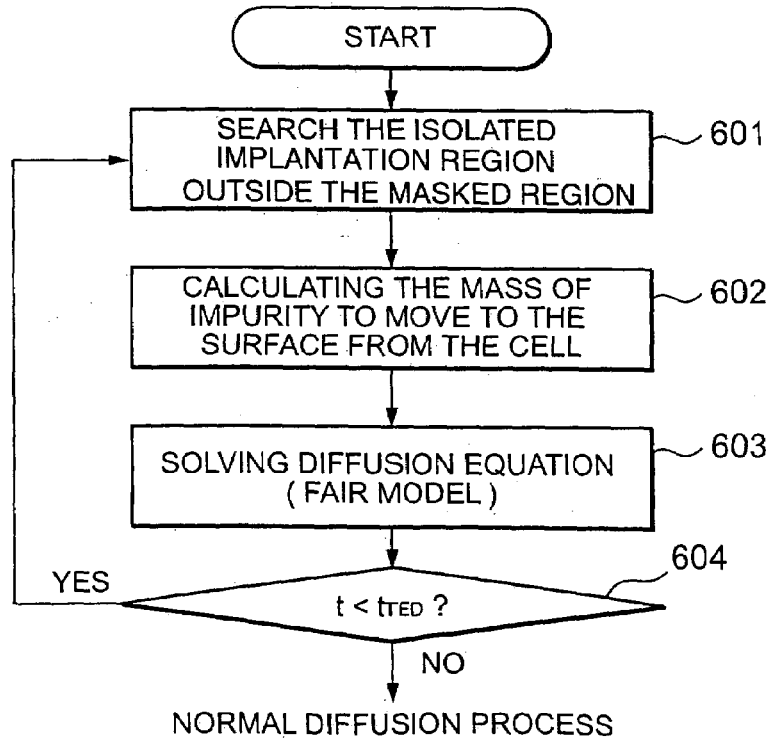
FIG. 7 is a flowchart showing a process of the method for modeling the semiconductor device process according to the fifth embodiment.

FIG. 6 is an explanatory view of the method for modeling the semiconductor device process according to the fifth embodiment, and FIG. 7 is a flowchart showing the method for modeling the semiconductor device process according to the fifth embodiment.

As shown in FIG. 6, in a semiconductor element 500, except an implantation region contributing to the impurity pileup in the interface, an isolated region 532 formed of the same type of impurities beforehand exists in the distance r2 to an S/D region position from each cell in the Si layer treated in calculating the movement mass of impurity moving to the interface. In this case, a mask 505 is used, and the isolated region is excluded from a search object. Additionally, the S/D region mentioned herein refers to a region in which an excessive point defect is generated by implantation, and does not necessarily refer to the S/D region.

In the example of FIG. 6, first an implantation region formed of the same type of isolated impurities is searched in an analysis region excluding a range defined by the mask. For example, a cell 522 refers to a closest region 530, and a cell 524 refers to a closest region 528. Since the closest region 532 of a cell 526 is in the range defined by the mask 505 and is other than the search object, the region 528 is referred to. Additionally, reference numeral 533 denotes an element isolation region, and the cells in the Si layer existing on the right side of the element isolation region 533 are excluded from the search object in the fifth embodiment.

As shown in FIG. 7, based on the aforementioned method, first the isolated implantation region is searched in the analysis region outside the range defined by the mask (step 601), and the mass of impurities moving to the interface from respective cells such as the cells 522, 524, and 526 is calculated and moved (step 602).

Subsequently, the diffusion equation is solved by the Fair model (step 603). When a heat treatment time t does not exceed a time $t_{TED}$ (transient enhanced diffusion duration) (step 604), the flow returns to the step 601. When the heat treatment time exceeds the time $t_{TED}$, the flow advances to a normal diffusion process.

According to the fifth embodiment, when a mask designation function already mounted usually on software is used, the region formed as the object by the implantation can advantageously and easily be segmented from the other regions at a small development cost.

(Sixth Embodiment)

In the method for modeling the semiconductor device process according to a sixth embodiment, an impurity profile constituted in the first to fifth embodiments is used to model the reverse short channel effect of the threshold voltage. The equations for use conform to those of the first embodiment.

In general, parameters corresponding to the respective processes are introduced in order to reproduce the process dependence of the reverse short channel effect of the threshold voltage. In the sixth embodiment, $\lambda 1$ and $\lambda 2$ associated with the distance r1 to the interface cell from the arbitrary cell in the Si layer and distance r2 to the S/D region during calculation of the mass of impurity moving to the interface are used as a function of a diffusion length of the point defect to represent the following equations.

$$\lambda 1 = \alpha \times (Di \times t_{TED}) \quad \text{(Equation 10)}$$

$$\lambda 2 = \beta \times (Di \times t_{TED}) \quad \text{(Equation 11)}$$

Here, $\alpha$ and $\beta$ are parameters, and $\alpha$ is a parameter representing the S/D process dependence, and absorbs the process dependence in the S/D formation. The parameter $\beta$ represents the Si layer density dependence, and absorbs the process dependence such as a dependence of a threshold voltage control implantation condition. Moreover, a parameter A for adjusting the magnitude of the reverse short channel effect of the threshold voltage is introduced.

In the sixth embodiment, since the parameter corresponding to the process condition is introduced in this manner, the process condition dependence of the reverse short channel effect of the threshold voltage can be reproduced, and experimental measurement is easily combined at a small calculation cost.

Figure 8:
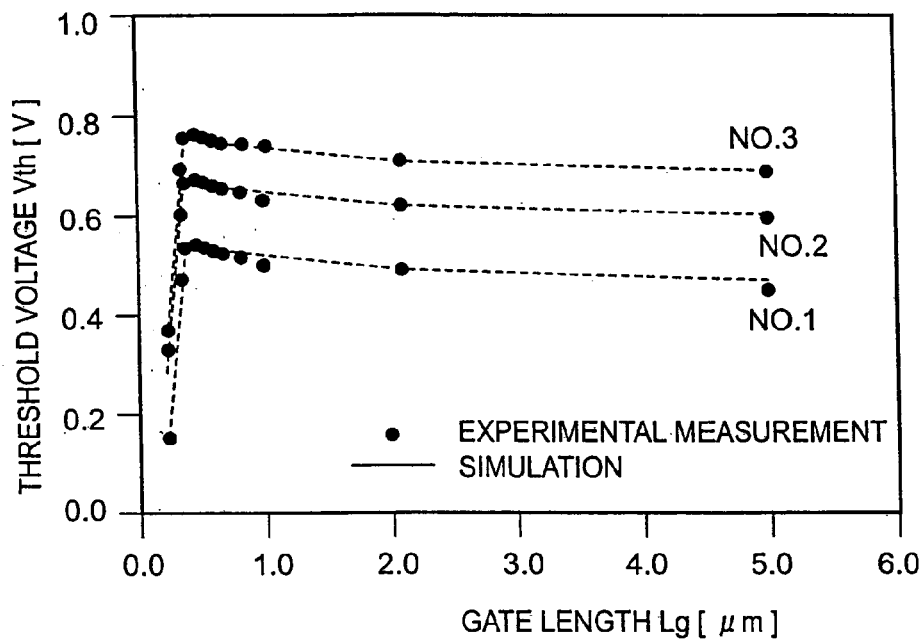
FIG. 8 is an explanatory view of the method for modeling the semiconductor device process according to a sixth embodiment.
Figure 9:
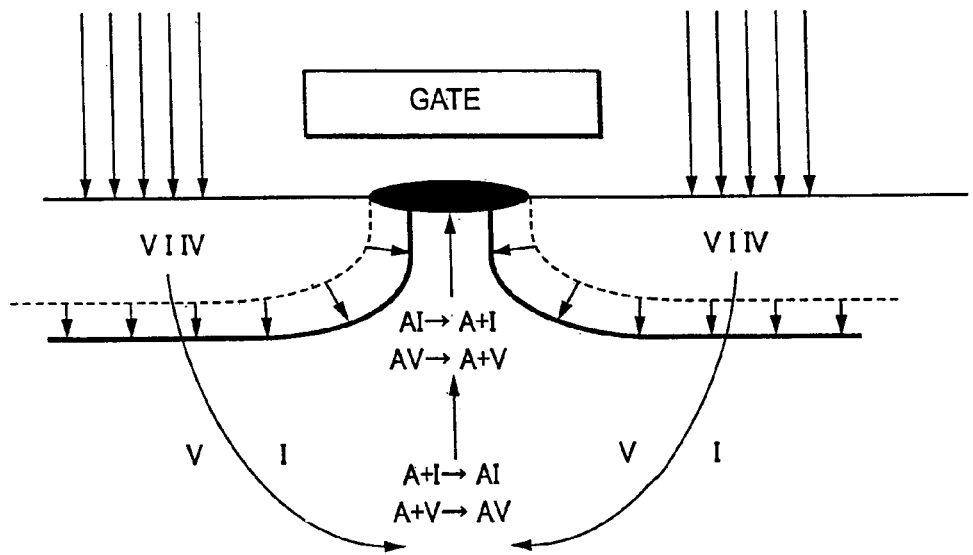
FIG. 9 is an explanatory view of a mechanism of impurity diffusion.
Figure 10A:
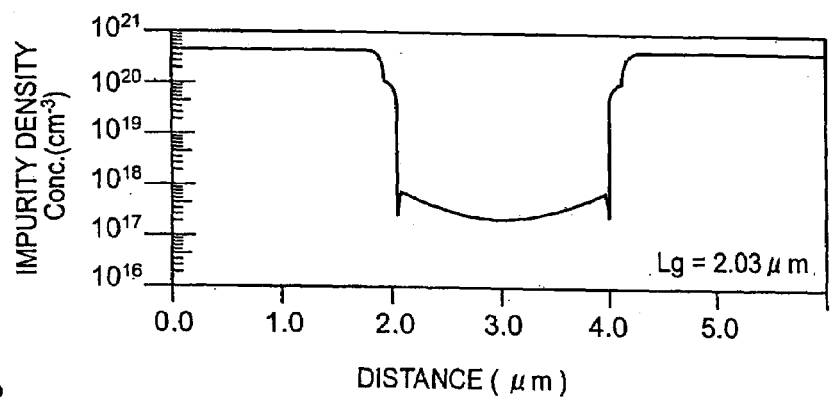
FIG. 10A–10C show characteristic curves of a relation between a channel longitudinal direction distance and an impurity density for different respective gate lengths.
Figure 10B:
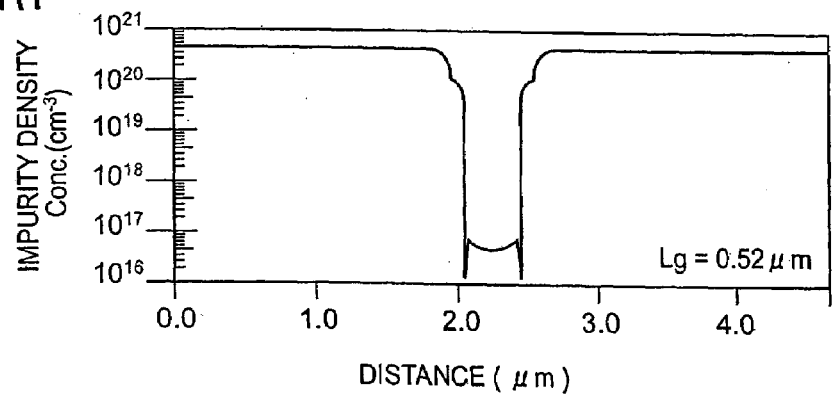
Figure 10C:
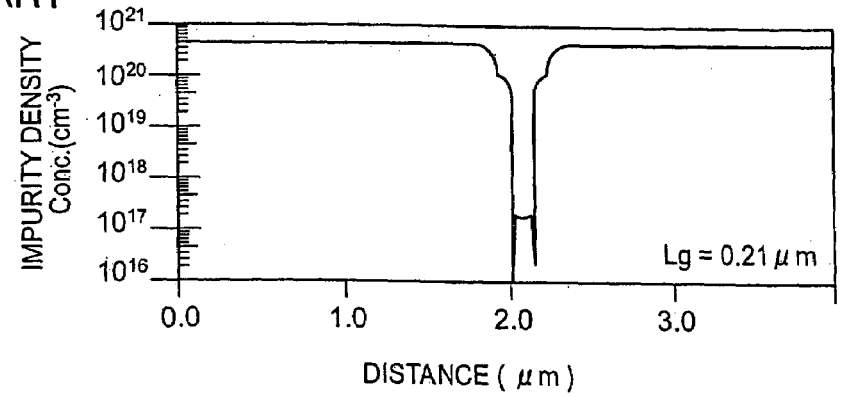
Figure 11:
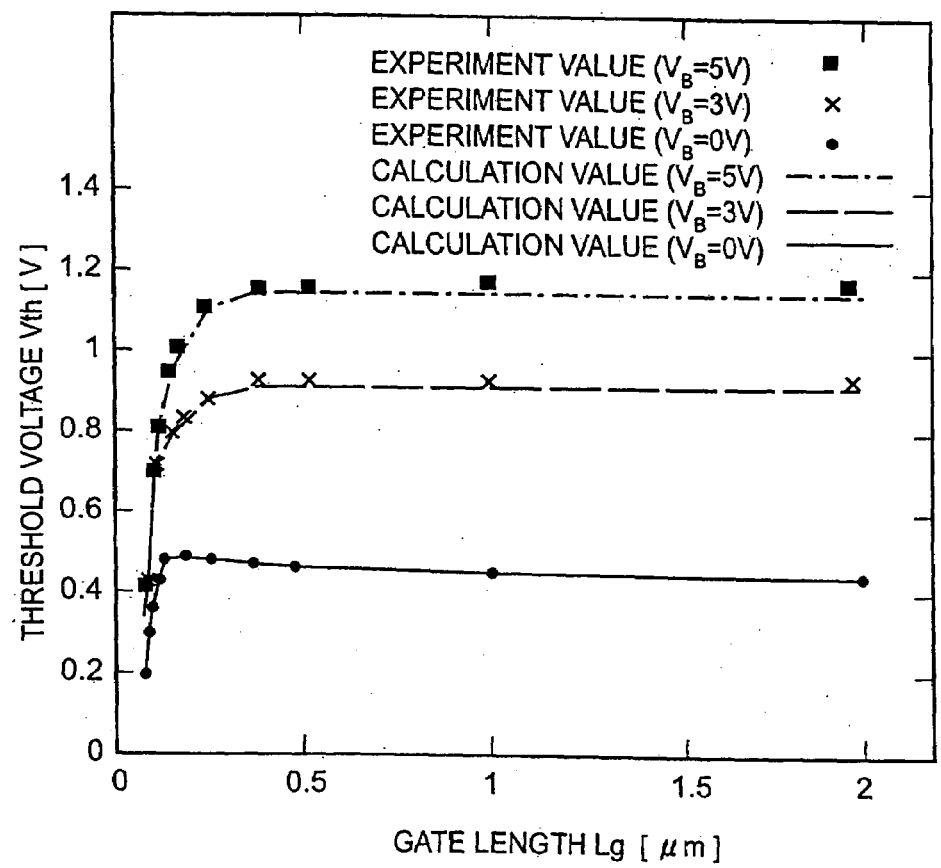
FIG. 11 shows a characteristic curve of a relation between a gate length and a threshold voltage.
Figure 12:
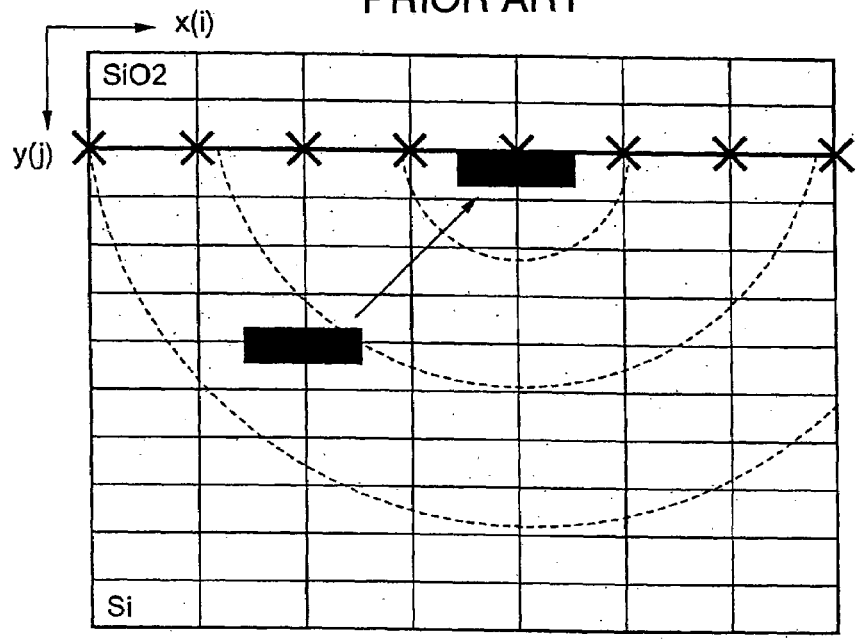
FIG. 12 is an explanatory view of a conventional simple model.
Figure 13:
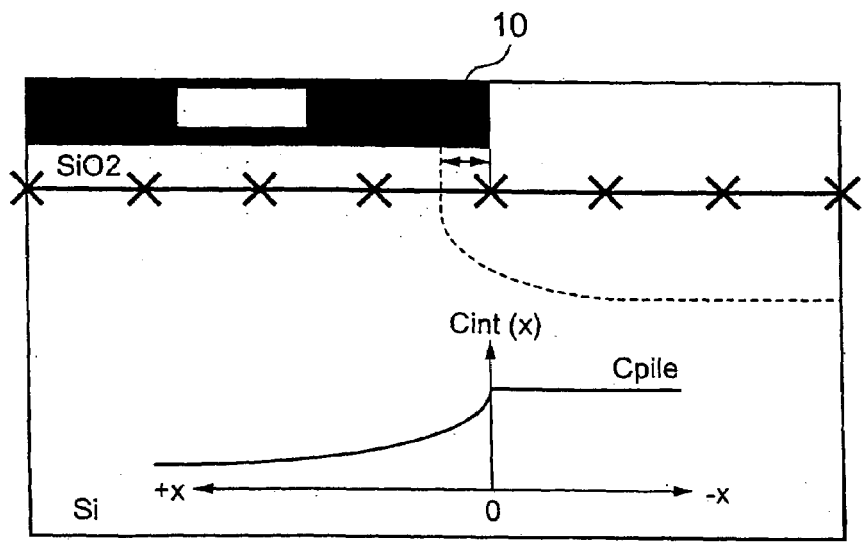
FIG. 13 is a diagram showing a distribution of a pileup amount in an Si/$SiO_2$ interface.

FIG. 8 shows a result of simulation of gate length dependence of the threshold voltage by the calculation method together with experimental measurement values. Here, characteristic curves concerning three process condition Nos. 1, 2, 3 are shown, and in any case a result remarkably approximate to the experimental measurement value is obtained.

The preferred embodiments of the method for modeling the semiconductor device process and program according to the present invention have been described above with reference to the accompanying drawings, but the present invention is not limited to these embodiments. A person skilled in the art would apparently develop various modifications in a category of technical thoughts described in the appended claims, and such modifications are also naturally deemed to fall within a technical scope of the present invention.

For example, in the method for modeling the semiconductor device process according to the present invention, manufacturing may be carried out by an SOI process. In this case, an Si layer sandwiched between a gate oxide film and a BOX layer, and an Si layer as the substrate exists.

Among these Si layers, the impurity pileup by the heat treatment is not generated in the Si layer as the substrate. This is because the impurity pileup is determined by a positional relation between an atmospheric air (gas and air) and respective layers. Therefore, in this case, when the parameter is selectively adjusted with respect to two interfaces between the gate oxide film and BOX layer, and the sandwiched Si layer, the method of the present invention can be applied.

Moreover, a simulation part from when the process condition is inputted until the electric property is outputted can also be replaced with an apparatus.

As described above, according to the present invention, there can be provided a method for modeling the semiconductor device process in which the S/D process dependence of the impurity pileup in the interface of Si and $SiO_2$ and the shape of the impurity pileup can be reproduced in the frame of the Fair model, the impurity profile can be used to reproduce the reverse short channel effect of the threshold voltage, and high-speed calculation is enabled.

What is claimed is:

1. A method for modeling a semiconductor device process, comprising:
   (a) setting data of an $SiO_2$ layer;
   (b) setting data of an Si layer brought in contact with said $SiO_2$ layer;
   (c) setting a plurality of cells in said Si layer, and setting an amount of an impurity included in each of said cells;
   (d) setting an amount per unit time by which said impurity included in each of said cells moves to another cell;
   (e) setting data by which a cell in a vicinity of an interface of said $SiO_2$ layer and said Si layer is set as an impurity pileup portion;
   (f) setting data of a position of a source or a drain in said Si layer; and
   (g) calculating the amount of said impurity included in each of said cells for each unit time after processing said steps (a) through (f),
   wherein an amount of said impurity in each of said cells moving to said impurity pileup portion from each of said cells is determined as an impurity density as a function of a distance r1 to said impurity pileup portion from each of said cells, and a function of a distance r2 to said source or said drain from each of said cells,
   wherein the function of the distance r1 is $\exp(-r1/\lambda 1)$, wherein the function of the distance r2 is $\exp(-r2/\lambda 2)$, and wherein $\lambda 1$, $\lambda 2$ are source and drain process dependent parameters, wherein $\lambda 1 = 2.0$ μm and $\lambda 2 = 0.5$ μm.

2. A method for modeling a semiconductor device process, comprising:
   (a) setting data of an $SiO_2$ layer;
   (b) setting data of an Si layer brought in contact with said $SiO_2$ layer;
   (c) setting a plurality of cells in said Si layer, and setting an amount of an impurity included in each of said cells;
   (d) setting an amount per unit time by which said impurity included in each of said cells moves to another cell;
   (e) setting data by which a cell in a vicinity of an interface of said $SiO_2$ layer and said Si layer is set as an impurity pileup portion;
   (f) setting data of a position of a source or a drain in said Si layer; and
   (g) calculating the amount of said impurity included in each of said cells for each unit time after processing said steps (a) through (f),
   wherein an amount of said impurity in each of said cells moving to said impurity pileup portion from each of said cells is determined as an impurity density as a function of a distance r1 to said impurity pileup portion from each of said cells, and a function of a distance r2 to said source or said drain from each of said cells,
   wherein the amount of said impurity moving to said pileup portion from each of said cells is determined as a product of the function of the distance r1 and the function of the distance r2.

* * * * *